US007176173B2

(12) United States Patent
Takashima

(10) Patent No.: US 7,176,173 B2
(45) Date of Patent: Feb. 13, 2007

(54) WASHING LIQUID FOR SEMICONDUCTOR SUBSTRATE AND METHOD OF PRODUCING SEMICONDUCTOR DEVICE

(75) Inventor: Masayuki Takashima, Sodegaura (JP)

(73) Assignee: Dongwoo Fine-Chem Co., Ltd., Seoul (KR)

( * ) Notice: Subject to any disclaimer, the term of this patent is extended or adjusted under 35 U.S.C. 154(b) by 159 days.

(21) Appl. No.: 10/659,190

(22) Filed: Sep. 10, 2003

(65) Prior Publication Data

US 2004/0084061 A1    May 6, 2004

(30) Foreign Application Priority Data

Sep. 19, 2002   (JP) .............................. 2002-272683

(51) Int. Cl.
*C11D 1/62* (2006.01)
(52) U.S. Cl. ........................................ 510/175; 134/1.3
(58) Field of Classification Search ................. 510/176, 510/175, 499; 134/2.3, 38, 1.3; 430/331; *C11D 3/30; B24B 1/00*
See application file for complete search history.

(56) References Cited

U.S. PATENT DOCUMENTS

| | | | | |
|---|---|---|---|---|
| 5,174,816 A | * | 12/1992 | Aoyama et al. ......... | 106/217.6 |
| 5,567,574 A | * | 10/1996 | Hasemi et al. .......... | 430/331 |
| 5,705,089 A | * | 1/1998 | Sugihara et al. ........ | 252/79.1 |
| 5,846,695 A | * | 12/1998 | Iwata et al. ............ | 430/331 |
| 5,905,063 A | * | 5/1999 | Tanabe et al. ........... | 510/176 |
| 5,968,848 A | * | 10/1999 | Tanabe et al. ........... | 438/745 |
| 6,030,932 A | * | 2/2000 | Leon et al. ............. | 510/175 |
| 6,440,326 B1 | * | 8/2002 | Maruyama et al. ....... | 252/79.1 |
| 6,638,694 B2 | * | 10/2003 | Ikemoto et al. ......... | 430/331 |
| 6,773,873 B2 | * | 8/2004 | Seijo et al. ............ | 430/329 |
| 6,815,151 B2 | * | 11/2004 | Tanabe et al. ........... | 430/329 |
| 2003/0158059 A1 | * | 8/2003 | Sakai et al. ............ | 510/175 |

FOREIGN PATENT DOCUMENTS

JP    04-048633 A    2/1992

* cited by examiner

*Primary Examiner*—Gregory E. Webb
(74) *Attorney, Agent, or Firm*—Akin Gump Strauss Hauer & Feld, LLP

(57) ABSTRACT

An object of the present invention is to provide washing liquid for semiconductor substrate capable of removing grinding grains of silica, alumina or the like in a polishing agent and polishing trashes of copper, and capable of leaving little organic substance due to an additive used for preventing corrosion of copper on the surface of a copper wiring after washing, while corrosion of copper is suppressed, and a method of producing a semiconductor device using this washing liquid. The object is achieved by washing liquid for a semiconductor substrate having a copper wiring, comprising a basic compound and at least one selected from the group consisting of sugar alcohols and saccharides. Also the present invention provides a method of producing a semiconductor device comprising a step of forming a copper wiring by chemical mechanical polishing and washing it with washing liquid for a semiconductor substrate containing a basic compound and at least one selected from the group consisting of sugar alcohols and saccharides.

3 Claims, 1 Drawing Sheet

(a)

(b)

(c)

(d)

WASHING LIQUID FOR SEMICONDUCTOR SUBSTRATE AND METHOD OF PRODUCING SEMICONDUCTOR DEVICE

FIELD OF THE INVENTION

The present invention relates to washing liquid for a semiconductor substrate having a copper wiring and the method of producing a semiconductor device.

BACKGROUND OF THE INVENTION

Recently, various materials are being developed for high integration and high performance of semiconductor devices. As the wiring materials in devices, aluminum and its alloys are used conventionally.

An aluminum wiring is formed by patterning with a photoresist on an aluminum membrane formed on an insulation membrane, etching, and then, peeling the masked photoresist. Therefore, on the surface of the aluminum wiring, there is significant adhesion of the photoresist not peeled, and there are the residue of the photoresist ashed by oxygen plasma and the like during etching, and gas components used in patterning and plasma treating, on the side surface of the aluminum wiring, bottom between the wiring and wiring, top of the wiring, and the like.

For removing these residues, there is disclosed a method of using an aqueous solution containing a quaternary ammonium hydroxide, and saccharides or sugar alcohol (JP 04-048633A).

On the other hand, a copper wiring is paid to attention as a wiring material in a device, for higher performance and higher speed treatment of a semiconductor device.

A copper wiring is formed by previously forming an insulation membrane having grooves, then, burying copper in the grooves by a plating method and the like, and polish-removing the copper membrane on parts other than the grooves by a chemical mechanical polishing method (hereinafter sometimes abbreviated as CMP) using a polishing agent containing grinding grains of silica, alumina or the like having a diameter of 1 μm or less and an additive for preventing corrosion of copper, and a polishing pad made of a material such as polyurethane and the like. Consequently, on the surface after formation of a copper wiring, there is significant adhesion of grinding grains of silica, alumina or the like in the polishing agent used for CMP, and fine polishing trashes of copper polished from the surface, on the surface of the buried copper wiring and on the insulation membrane.

Since it is also necessary that an insulation membrane is formed on the surface of the copper wiring, after a copper wiring is formed by CMP, and washing with washing liquid is conducted, there is a problem that an organic substance due to an additive contained in washing liquid remains and poor adherence occurs between the copper wiring and insulation membrane.

Therefore, there has been a desire for development of washing liquid capable of removing grinding grains of silica, alumina or the like in a polishing agent, and polishing trashes of copper, additionally, leaving little organic substance due to an additive used for preventing corrosion of copper on the surface of a copper wiring after washing, while corrosion of copper, which is corroded more easily than aluminum, is suppressed.

SUMMARY OF THE INVENTION

The present inventors have intensively studied to find washing liquid capable of solving the above-mentioned problems, and resultantly found that washing liquid containing sugar alcohols or saccharides and a basic compound such as a hydroxide is capable of removing grinding grains of silica, alumina or the like in a polishing agent and polishing trashes of copper and the like, which is different from the residue of a photoresist and ashed photoresist, and that the washing liquid leaves little organic substance on the surface of a copper wiring after washing. Therefore, it is found that such washing liquid is suitable for washing a semiconductor substrate having a copper wiring, leading to completion of the invention.

That is, the present invention provides washing liquid for a semiconductor substrate having a copper wiring, comprising a basic compound and at least one selected from the group consisting of sugar alcohols and saccharides. Further the present invention provides a method of producing a semiconductor device, comprising a step of forming a copper wiring by chemical mechanical polishing and washing with washing liquid for a semiconductor substrate comprising a basic compound and at least one selected from the group consisting of sugar alcohols and saccharides.

DETAILED DESCRIPTION OF THE PRESENT INVENTION

Figure 1:
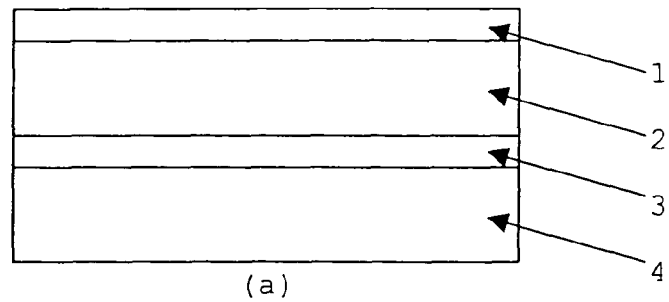
FIG. 1: Schematically showing the process for producing a semiconductor substrate having a copper wiring.
1: a silicon oxide membrane
2: a silicon nitride membrane
3: an inter-layer insulation membrane
4: a cap layer membrane
5: a barrier metal membrane
6: a copper membrane
7: a cap layer
Figure 1:
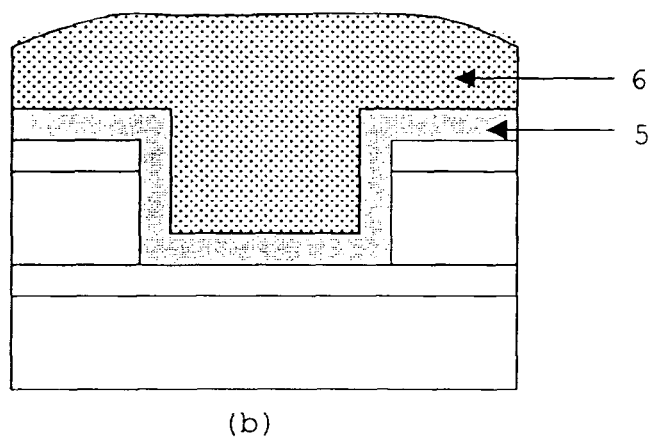
Figure 1:
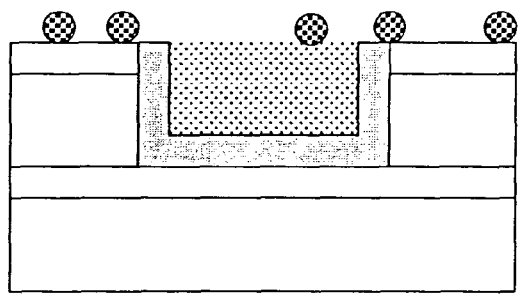
Figure 1:
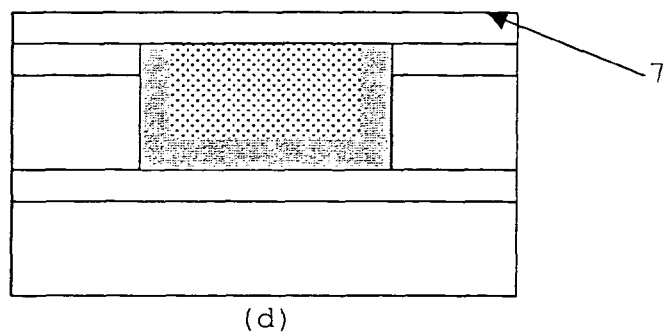

The washing liquid for semiconductor substrate of the present invention is used for a semiconductor substrate having a copper wiring, and contains sugar alcohols and/or saccharides, and a basic compound in a solvent.

Here, the copper wiring includes also wirings of copper alloys.

Examples of the sugar alcohols used in the present invention include threitol, erythritol, adonitol, arabitol, xylytol, talytol, sorbitol, mannitol, iditol, dulcitol, glucose, mannose, galactose and the like, and preferable are glucose, mannose, galactose, sorbitol, mannitol and xylytol from the standpoint of solubility, and among them, mannitol is more preferable.

The saccharides include monosaccharides, polysaccharides and the like, and examples thereof include saccharides having 3 to 6 carbon atoms such as glycerin aldehyde, treose, erythrose, arabinose, xylose, ribose, ribulose, xylrose, glucose, mannose, galactose, tagatose, allose, altrose, gulose, idose, talose, sorbose, psicose, fructose and the like.

Examples of the basic compound used in the present invention include quaternary ammonium hydroxides such as tetramethylammonium hydroxide, choline and the like, ammonium hydroxide salt, hydroxides of alkali metals or alkaline earth metals such as potassium, sodium and the like, and amino group-containing compounds such as aklanolamines such as monoethanolamine, diethanolamine, triethanolamine, 2-methylaminoethanol, 2-ethylaminoethanol, N-methyldiethanolamine, dimethylaminoethanol, 2-(2-aminoethoxy)ethanol, 1-amino-2-propanol, monopropanolamine, dibutanolamine and the like, and from the standpoint of not causing metal pollution on the surface of an electronic part, preferable are tetramethylammonium hydroxide and ammonium hydroxide, and more preferable is tetramethylammonium hydroxide.

The concentration of sugar alcohols or saccharides in the washing liquid of the present invention is preferably from 0.001 wt % to 15 wt % from the standpoint of an effect of preventing corrosion of copper, and solubility of sugar alcohols and saccharides in washing liquid, which depend on the kind of sugar alcohols or saccharides used. If the solubility of alcohols or saccharide is insufficient, its residue may be formed on the surface of copper after washing. A residual organic substance on the surface of copper after washing a substrate having a copper wiring can be measured using an X-ray excitation photoelectron spectral apparatus. Namely, it can be evaluated by a ratio of photoelectron strength of copper to photoelectron strength of carbon in an organic substance (C/Cu), both of which are excited by irradiation of the surface of copper with X-ray. When C/Cu value after washing is higher than C/Cu before washing, it indicates that an organic substance remains on the surface of copper by washing. For reducing such a residual organic substance and maintaining an ability of preventing corrosion of copper, the concentration of sugar alcohols or saccharides is more preferably from 0.001 wt % to 5 wt %.

The concentration of a basic compound in washing liquid is preferably from 0.01 wt % to 10 wt %, more preferably 0.05 wt % to 1 wt %. When less than 0.01 wt %, the effect of removing particle may be insufficient in some cases, and when over 10 wt %, basicity of washing liquid increases and corrosion may occur on the surface of a copper wiring, in some cases.

The solvent in the washing liquid of the present invention is not particularly restricted, and include water and organic solvent. Of them, water is preferable.

An organic solvent include (poly)alcohols and their derivatives, amides, ketones, esters and compounds containing sulfur.

(Poly) alcohols and their derivatives include, for example, methanol, ethanol, propanol, 2-methoxy-ethanol, 2-ethoxy-ethanol, 2-isopropoxy-ethanol, furfuryl alcohol, tetrahydrofurfuryl alcohol, diethyleneglycol monomethyl ether, diethyleneglycol monoethyl ether, diethyleneglycol monobutyl ether, diethyleneglycol dimethyl ether, diethyleneglycol diethyl ether, diethyleneglycol monomethyl ether acetate, diethyleneglycol monoethyl ether acetate.

Amides include, for example, N-methyl pyrrolidone, dimethyl acetamide, N,N-dimethyl formamide, N-methyl formamide and 1,3-dimethyl-2-imidazolidone, and preferable are N,N-dimethyl formamide and N-methyl pyrrolidone.

Ketones include, for example, acetone, methyl ethyl ketone and methyl isobutyl ketone.

Esters include, for example, r-butyrolactone and ethylene carbonate.

Compounds containing sulfur include, for example, dimethyl sulfoxide and sulforane.

These organic solvents may be mixed with water in an arbitrary ratio.

The washing liquid of the present invention may contain other components not corroding the surface of a copper wiring and not preventing a property of removing grinding grains of a polishing agent of silica, alumina or the like and copper polishing trashes. Other components may include, for example, various chelating agents such as carboxylic acids and aromatics, anionic, cationic or nonionic surfactants, dispersing agents and the like.

The washing liquid of the present invention is suitable for washing a substrate having a surface on which copper or alloy mainly composed of copper is exposed, and suitably used as washing liquid after polishing with Cu-CMP particularly conducted in a process of producing a semiconductor device.

More specifically, as shown in FIG. 1(a), a silicon oxide membrane 1 and a silicon nitride membrane 2 are formed on a semiconductor substrate (not shown) functional elements such as a transistor and the like formed thereon, then, an inter-layer insulation membrane 3 is formed for insulation between wirings, thereafter, a cap layer membrane 4 or the like is formed for protecting the inter-layer insulation membrane. The inter-layer insulation membrane includes, for example, inorganic membranes such as a silicon oxide membrane ($SiO_2$ membrane), FSG (F-containing $SiO_2$) membrane as a low dielectric constant inter-layer insulation membrane, SiOC (carbon-containing $SiO_2$) membrane, SiON (N-containing $SiO_2$) membrane and the like, polyorganosiloxane membranes such as a MSQ (methylsilsesquioxane) membrane, HSQ (hydrogensilsesquioxane) membrane, MHSQ (methylated hydrogensilsesquioxane) membrane and the like, aromatic membranes such as a PAE (polyaryl ether) membrane, BCB (divinylsiloxane-bis-benzocyclobutene) membrane and the like, a Silk membrane, porous Silk membrane and the like. As the cap layer membrane, membranes of $SiO_2$, SiC, SiN, SiCN and the like are used.

Thereafter, grooves are formed by utilizing a known lithography process, then, as shown in FIG. 1(b), a barrier metal membrane 5 and a copper membrane 6 are formed, and the copper membrane and barrier metal membrane are polished using a known CMP process to form a copper wiring.

Thereafter, as shown in FIG. 1(c), polishing trashes adhered on the surface by polishing, and slurry components in a polishing agent are removed by using washing liquid.

The washing liquid of the present invention is used in removing polishing trashes and slurry components in a polishing agent shown in FIG. 1(c).

Thereafter, washing is conducted, then, washing liquid components remaining on the surface of a substrate are removed by water rinse, then, a cap layer 7 is again formed on a copper wiring as shown in FIG. 1(d). When washing liquid components are not removed easily by water rinse and remain there, adherence between the copper wiring and interface of cap layer decreases and the performance of the copper wiring is deteriorated. Therefore, washing liquid which can be removed easily in a short period of time is preferable.

The washing method in FIG. 1(c) includes an immersion washing method by directly immersing a substrate in washing liquid, a method of simultaneously conducting irradiation with ultrasonic wave together with the immersion washing method, a brush washing method of conducting washing with a brush while spraying washing liquid on the surface of a substrate, a method of simultaneously conducting irradiation with ultrasonic wave together with the brush washing method, and the like. In washing, washing liquid may be heated. Preferable is a washing method of removing polishing trashes and slurry components in a polishing agent without etching of an insulation membrane and copper wiring or corroding a copper wiring.

In addition to the above-mentioned methods, the washing liquid of the present invention can be applied also to washing of a copper wiring and the like formed on a print wiring substrate.

EXAMPLES

The present invention will be illustrated by examples further in detail, however, the present invention is not limited to the examples.

Examples 1 to 5 and Comparative Example 1

Washing liquids of compositions shown in Table 1 were prepared. In these washing liquids, a silicon wafer on which a 4000 Å copper (Cu) membrane had been formed by a plating method was immersed as a test piece at 40° C. for 5 minutes, then, rinsed in ultra pure water for 30 seconds. An effect of suppressing corrosion of Cu by the washing liquid was judged by measuring the thickness of a Cu membrane before and after washing treatment and calculating solution speed (etch rate) based on the change amount of the membrane thickness. The surface before and after washing treatment was observed by an electron microscope, and the condition of the surface of a Cu membrane was observed. The results are shown in Table 1. As shown in Table 1, the washing liquids of the present invention were extremely effective for preventing corrosion of copper though they are basic aqueous solutions.

EXAMPLE 6

Washing liquid of a composition shown in Table 1 was prepared. In this washing liquid, a silicon wafer on which a 4000 Å copper (Cu) membrane had been formed by a plating method was immersed as a test piece at 40° C. for 5 minutes, then, rinsed in ultra pure water for 30 seconds. The amount of residual carbon on the surface of the sample before and after washing treatment was measured by an X-ray excitation photoelectron spectral apparatus. The residual carbon amounts were relatively compared by measuring the ratio of photoelectron strength derived from Cu membrane to photoelectron strength derived from carbon (C) on the surface. The residual carbon amount C/Cu on the surface of copper before conducting washing treatment was 1.19. The results are shown in Table 2. As shown in Table 2, washing liquid composed of tetramethylammonium hydroxide and mannitol shows approximately the same level of residual carbon after washing as that before washing.

TABLE 1

|  | Example | | | | | Comparative example |
| --- | --- | --- | --- | --- | --- | --- |
|  | 1 | 2 | 3 | 4 | 5 | 1 |
| TMAH (wt %) | 2.4 | 1.0 | 0.5 | 0.2 | 0.2 | 0.2 |
| Mannitol (wt %) | 3.0 | 0.16 | 0.16 | 0.08 |  |  |
| Xylytol (wt %) |  |  |  |  | 0.08 |  |

TABLE 1-continued

|  | Example | | | | | Comparative example |
| --- | --- | --- | --- | --- | --- | --- |
|  | 1 | 2 | 3 | 4 | 5 | 1 |
| Cu etch rate (Å/minute) | 12.8 | 6.4 | 3.0 | 0.0 | 1.2 | 17.1 |
| surface condition | Δ | ○ | ○ | ○ | ○ | X |

TMAH: tetramethylammonium hydroxide
X: Cu surface is etched significantly
Δ: Cu surface is roughened slightly
○: Cu surface is not roughened

TABLE 2

|  | Example 6 |
| --- | --- |
| TMAH (wt %) | 0.2 |
| Mannitol (wt %) | 0.08 |
| Cu etch rate (Å/minute) | 0.0 |
| surface condition | ○ |
| C/Cu | 0.90 |

EXAMPLE 7

A semiconductor substrate for copper wiring having a structure shown in FIG. 1(b) was polished by a CMP polishing apparatus and a known polishing agent containing grinding grains made of silica, then, immersed in the washing liquid shown in Example 6 at 40° C. for 2 minutes, to effect washing thereof. During washing, irradiation with ultrasonic wave having a frequency of 950 kHz was used together.

Then, the surface of the copper wiring was observed by an electron microscope, as a result, silica grinding grains and the like significantly adhered before washing were removed completely, and etching and corrosion were not observed at all on the surface of the copper wiring.

According to the present invention, it is possible to provide washing liquid for semiconductor substrate removing polishing agent grains of silica, alumina or the like and polishing trashes of copper and the like generated by polishing and showing little residual organic substances after washing, while suppressing corrosion of copper.

What is claimed is:

1. A method of producing a semiconductor device, comprising a step of forming a copper wiring by chemical mechanical polishing and washing with washing liquid for a semiconductor substrate comprising a quaternary ammonium hydroxide and mannitol.

2. The method according to claim 1, wherein the concentration of the mannitol is from 0.01 to 5 wt%.

3. The method according to claim 1, wherein the concentration of the quaternary ammonium hydroxide is from 0.05 to 1 wt%.

* * * * *